United States Patent [19]

Kawakami et al.

[11] Patent Number: 5,232,817
[45] Date of Patent: Aug. 3, 1993

[54] THERMAL TRANSFER IMAGE RECEIVING MATERIAL AND METHOD FOR PREPARING THEREFROM A PROOF FOR PRINTING

[75] Inventors: Sota Kawakami; Yasuo Kojima, both of Tokyo, Japan

[73] Assignee: Konica Corporation, Tokyo, Japan

[21] Appl. No.: 808,370

[22] Filed: Dec. 16, 1991

[30] Foreign Application Priority Data

Dec. 21, 1990 [JP] Japan ................... 2-413253

[51] Int. Cl.$^5$ ............... G03C 8/00; B41M 5/035
[52] U.S. Cl. ................. 430/201; 430/200; 430/257; 430/258; 503/227; 428/913; 428/914
[58] Field of Search ............ 430/200, 201, 203, 252, 430/253, 254, 256, 257, 258; 428/195, 913, 914; 503/227

[56] References Cited

U.S. PATENT DOCUMENTS

| | | | |
|---|---|---|---|
| 3,975,563 | 8/1976 | Franer et al. | 430/200 |
| 4,007,372 | 2/1977 | Lewhard et al. | 430/201 |
| 4,788,128 | 11/1988 | Barlow | 430/201 |
| 4,837,199 | 6/1989 | Morishita et al. | 503/227 |
| 4,897,377 | 1/1990 | Marbrow | 428/195 |
| 5,036,040 | 7/1991 | Chapman et al. | 430/201 |
| 5,055,329 | 10/1991 | Namiku et al. | 430/257 |
| 5,055,444 | 10/1991 | Kaszczuk | 428/914 |
| 5,059,579 | 10/1991 | Hart et al. | 428/913 |
| 5,075,146 | 12/1991 | Satake et al. | 428/913 |
| 5,077,263 | 12/1991 | Henzel | 428/913 |
| 5,139,996 | 8/1992 | Boyce et al. | 428/913 |

FOREIGN PATENT DOCUMENTS 1171887  6/1989  Japan ................... 503/227

OTHER PUBLICATIONS

RD-14223 "Flash Dye Transfer" Kodak Feb. 1976.

Primary Examiner—Charles L. Bowers, Jr.
Assistant Examiner—Martin J. Angebranndt
Attorney, Agent, or Firm—Frishauf, Holtz, Goodman & Woodward

[57] ABSTRACT

A thermal transfer image receiving material and a method for preparing therefrom a proof for printing are disclosed. The material comprises a support and provided thereon, a peelable layer and a first image receiving layer in this order, and the method comprises the steps of;
  contacting a thermal transfer layer onto the thermal transfer image receiving material,
  imagewise exposing the contacted materials to light,
  transferring the exposed portions of the transfer layer to the first image receiving layer, said transferring comprising transferring of at least yellow, magenta, and cyan color images on the first image receiving layer to form a color image, and
  transferring the formed color image to a second image receiving layer.

7 Claims, No Drawings

THERMAL TRANSFER IMAGE RECEIVING MATERIAL AND METHOD FOR PREPARING THEREFROM A PROOF FOR PRINTING

FIELD OF THE INVENTION

This invention relates to a thermal transfer image receiving material and a method for preparing a proof for printing. More specifically, this invention relates to a high-sensitive and thermally transferable image receiving material for thermal transfer and a method for preparing a proof for printing, which uses light energy effectively.

BACKGROUND OF THE INVENTION

As recording materials to obtain high quality images, there have been used so far silver salt recording materials and photo-sensitive resin recording materials, which need to be processed in a liquid after recording. Silver salt recording materials, for example, require a process to blacken exposed silver grains or a process to color-develop couplers to desired colors. And such processes need mostly a liquid processing agent. In the case of photo-sensitive resin recording materials, in which images are formed according to their attribute that the solubility or affinity to a developing solution is changed by exposure, a process to remove nonimage portions with a developing solution must be provided after exposure. But those processes which use a liquid yields a waste liquid which is not desirable for environmental sanitation.

Accordingly, thermal transfer recording has come to arouse considerable attention as an image forming method capable of dry-processing. However, in a thermal transfer recording method which uses a thermal head, resolution in recording is restricted by the integration degree of a thermal head. And, even with a thermal head having a high integration decree, improvement in image quality is limited because of interaction between adjacent heads.

As a measure to break through the limit of image quality with the thermal head, utilization of thermal patterns based on light-heat conversion is conceived. This comprises the steps of providing image information as a pattern of light and converting it into a pattern of heat to generate heat necessary to cause thermal transfer of information. As one of such thermal transfer recording methods using light-heat conversion, there has been proposed an image forming method which uses a heat-fusible transfer ribbon having a heat-fusible ink layer comprised of a wax-type binder dispersing carbon black in it and carries out recording by means of a flash-light irradiation through a light-transmittable original to form transferred images.

Further, a technique relating to a sublimation transfer sheet having an ink layer containing a light-absorbing exothermic substance is disclosed in Japanese Pat. O.P.I. Pub. No. 19533/1980.

However, these transferred image forming methods have a defect of insufficient sensitivity attributable to their low light-heat conversion efficiency.

On the other hand, there is demanded, in the method of forming multicolor images, a technique having a high retransferring efficiency in a proof manufacturing which comprises the processes of forming images of three primary colors on an image receiving layer and retransferring it to another support.

SUMMARY OF THE INVENTION

Accordingly, the object of this invention is to provide a thermal transfer image receiving material recording which can utilize light energy effectively and perform thermal transfer at a high sensitivity, and further, to provide a method for preparing a proof for printing having excellent efficiency in retransferring.

The present inventors have conducted an intensive study to materialize the above object and achieved this invention. The first embodiment of the invention is to provide a thermal transfer image receiving material comprising a support and provided thereon, a peelable layer and an image receiving layer in this order, and a preferable embodiment is that a light-heat converting substance is contained in said image receiving layer.

The second embodiment of the invention is to provide a thermal transfer image receiving material comprising a support and provided thereon, a peelable layer, a layer containing a light-heat converting substance and a binder, and an image receiving layer in this order, or to provide a thermal transfer image receiving material comprising a support and provided thereon, a layer containing a light-heat converting substance and a binder, a peelable layer, and an image receiving layer in this order.

In the method for preparing a proof for printing which comprises the steps of contacting an image receiving material having, on an image receiving support, a peelable layer and a thermal transfer image receiving in this order with a thermal transfer recording material having, on a support, at least a thermal transfer layer, and transferring a dye or ink corresponding to the light irradiated on the transfer layer to the image receiving layer by irradiating the light corresponding to the image from the direction of the image receiving material or the direction of the thermal transfer recording material, the method according to the invention is characterized in that after transfer is made at least for three colors of yellow, magenta and cyan, the color image formed on the image receiving layer is transferred again to another support. And a preferable embodiment of this invention is to provide a light-heat conversion layer between the image receiving support and the peelable layer; another preferable embodiment is to provide a light-heat converting layer between the peelable layer and the image receiving layer.

In the structure of the invention, the images of respective colors are transferred to an image receiving layer, the peelable layer is peeled off, and transferred image is retransferred to another support together with the image receiving layer. And a precise proof can be prepared by employing, as a support to receive a retransferred image, paper which is practically used in printing.

DETAILED DESCRIPTION OF THE INVENTION

Next, the invention is described in detail. (Image receiving material)

The image receiving material of the invention includes two types: for sublimation-type thermal transfer and for fusion-type thermal transfer. One embodiment of said image receiving material is to provide, on a support, a peelable layer and a thermal transfer image receiving in order; another embodiment is to provide, on a support layer, a peelable layer, a light-heat converting layer and a thermal transfer image receiving , or to provide a light-heat converting layer, a peelable layer and a thermal transfer image receiving layer in this order.

As the image receiving support, there may be used papers such as synthetic paper (for example, Upo made by Oji-Petrochem. and Peach Coat made by Nisshinbo Ind.), woodfree paper, art paper, coat paper, cast-coat paper, resin-coat paper, synthetic-resin-impregnated paper, latex-impregnated paper; films or sheets of plastics such as polyester, polyamide, polyimide, polyvinyl chloride, polyvinylidene chloride, polyvinylidene fluoride, polyacrylate, polyolefin, polycarbonate, polystyrene, phenolic resin, cellulose triacetate; and glass and metals (aluminium and stainless steel). When irradiation of light is made from the direction of the image receiving support in the embodiment of the invention, light-transmittable plastic films or sheets are used among the above supports.

These plastic films or sheets may contain a pigment or air bubbles for the purpose of coloring or improving bending strength. Examples of the pigment include carbonates of alkaline earth metals, $TiO_2$, MgO, ZnO, alumina, silica and carbon black.

The image receiving layer is comprised of a binder and additives.

Usable binders are polyamide resin (e.g., nylon), polyester resin, poly(meth)acrylate resin (e.g., polymethylmethacrylate, polyethylacrylate), polyurethane resin, polyvinyl chloride resin, polyvinylidene chloride resin, polystyrene resin, polyvinyl acetate resin, polyvinyl chloride-vinyl acetate resin, polyethylene resin, polypropylene resin, polybutadiene resin, polyvinyl alcohol resin, phenolic resin, cellulose resin (e.g., methyl cellulose, ethyl cellulose, carboxymethyl cellulose, nitrocellulose, acetyl cellulose), polyvinyl ether resin, polyvinylpyrrolidone resin, polyvinyl aniline resin, polysulfone, polycarbonate resin, melamine resin, epoxy resin, polyphenylene oxide resin, polyarylate resin, ionomer resin, polyether sulfone resin, polysiloxane resin, acetal resin (e.g., polyvinyl butyral, polyvinyl acetal, polyvinyl formal), petroleum resins, rosin-type resin, coumarone-indene resin, terpene-type resin, styrene-butadiene rubber, isoprene rubber and nitrile rubber.

As additives, basic compounds and mordants may be used. Examples of the basic compound include calcium carbonate, sodium carbonate, sodium acetate and alkyl amines; examples of the mordant include compounds having a tertiary amino group, compounds having a nitrogen-containing heterocyclic group, and their quaternary-cationic-group-containing compounds. The image receiving layer preferably contains the following light-heat converting substance.

The content of a light-heat converting substance in the image receiving layer is 5 to 50% by weight, and preferably 10 to 30% by weight.

In the invention, the image receiving layer is formed by coating, on an image receiving support directly or via a thermal insulation layer, a coating solution prepared by dissolving or dispersing the following light-heat converting substance and additives in a binder, by use of a coating means such as wire bar. The thickness of the image receiving layer is preferably 0.1 to 10 μm.

The peelable layer is formed by combination of a wax, binder and additives. This layer may be a layer which melts or softens on heating and undergoes cohesive failure by itself, or a layer which uses resins less adhesive to other resins, such as silicone resin, fluorine-type resin (e.g., Teflon, fluorine-containing acrylic resin), polysiloxane resin and acetal-type resin (e.g., polyvinyl butyral, polyvinyl acetal, polyvinyl formal).

Usable waxes are carnauba wax, montan wax, beewax, rice wax, candelilla wax, lanolin wax, paraffin wax, microcrystalline wax, polyethylene wax, sazol wax, oxidized wax, amide wax and silicone wax. The thickness of the peelable layer is preferably 0.1 to 3 μm, and especially 0.2 to 1 μm.

The light-heat converting layer is a layer which absorbs the light irradiated image-wise to raise the temperature. The light-heat converting layer is formed by combination of a light-heat converting substance, wax, binder and additives.

The light-heat converting substance is to utilize effectively the energy of high illumination light such as laser beams or flash-lamps, and pigments or dyes used for this purpose may be any of those which can convert a pattern of high illumination light into a pattern of heat.

When a flash-lamp is used for exposure, pigments having a broad absorption region are preferred. Particularly, those having absorption in the visible and near infrared regions are preferred; examples of thereof include carbon black, carbon graphite, phthalocyanine pigments, iron powder, graphite powder, iron oxide powder, lead oxide and blackened silver. Of them, carbon black is particularly preferred.

When a laser beam is used for exposure, dyes or pigments having an absorption region corresponding to the laser's emission wavelength are used. For a laser having no emission region in the visible region like infrared semiconductor laser, dyes or pigments having absorption in the visible region are not necessarily used, and infrared-absorbing coloring matters having no absorption in the visible region may be used. As a matter of course, the above dyes and pigments suitable for flash-light exposure may also be employed favorably.

The following are typical examples of the infrared-absorbing coloring matters including cyanine dyes, naphthoquinone dyes, phthalocyanine dyes and the like.

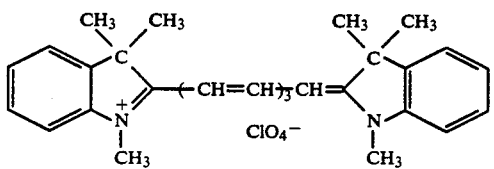

(1)

-continued
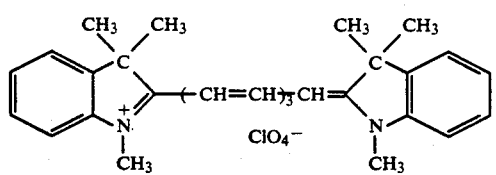
R: alkyl, Y: halogen, a: 1-4, X: anion
(2)
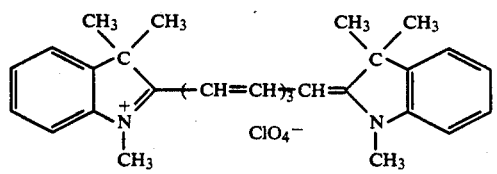
(3)
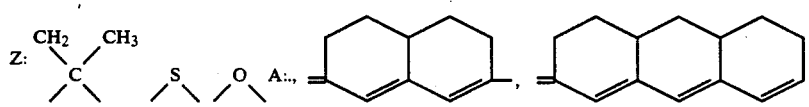
R: alkyl, X: anion
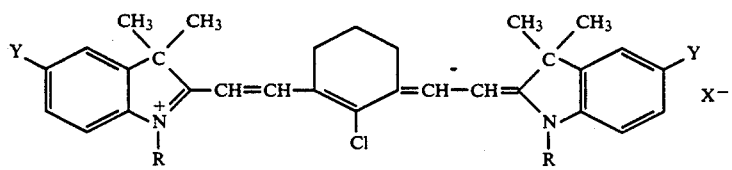
R: alkoxyalkyl, Y: H, halogen, X: anion,
(examples) R = C$_2$H$_4$OCH$_3$, Y = H, X = ClO$_4$
(4)
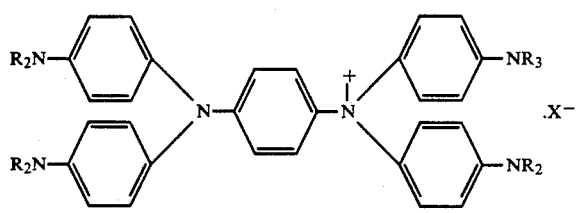
R: alkyl of C$_1$-C$_4$, X: anion
(examples) R = C$_4$H$_9$, X = SbF$_6$
(5)
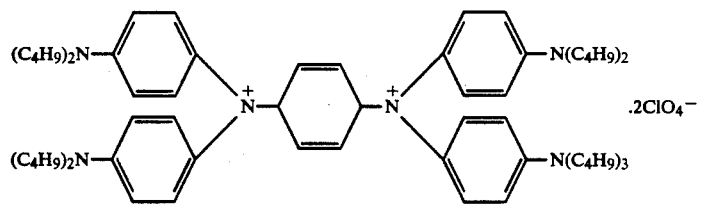
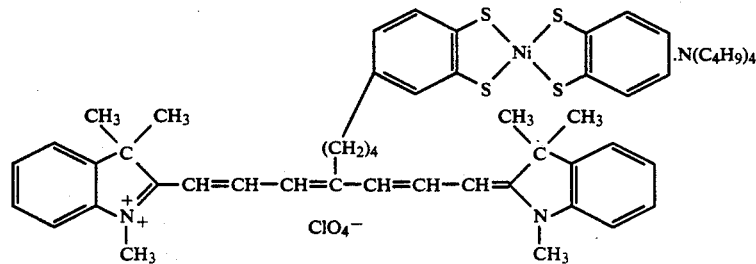
(6)

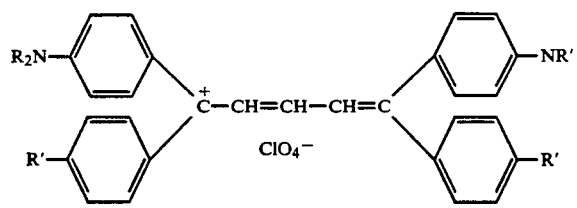
(7)
R: lower alkyl, R': NR₂, H, Cl
(examples) R = C₂H₅, R' = N(C₂H₅)₂
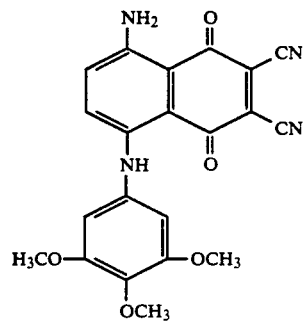
(8)
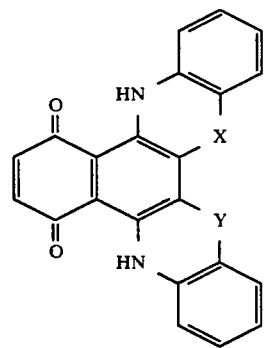
(9)
X, Y: SO or SO2, these may be the same or different.
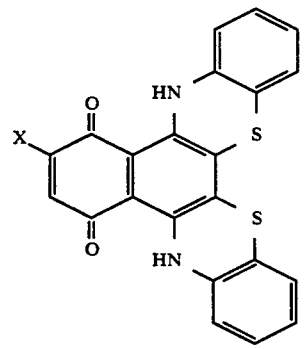
(10)
(examples) x; OCH₃ or —NHCH₂—⌬

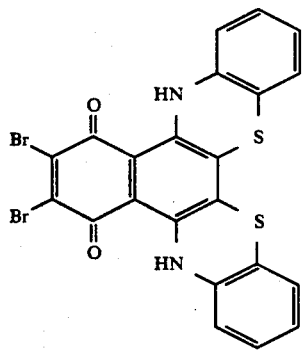
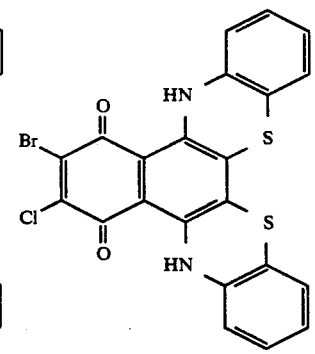
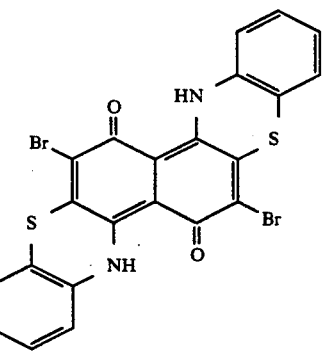
(11)
mixture of the above three compounds.
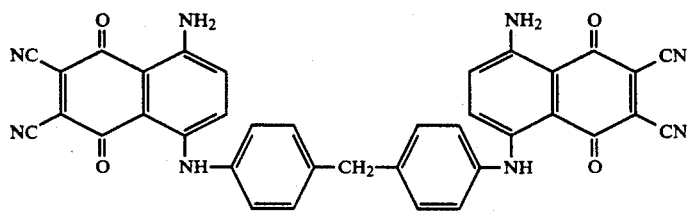
(12)
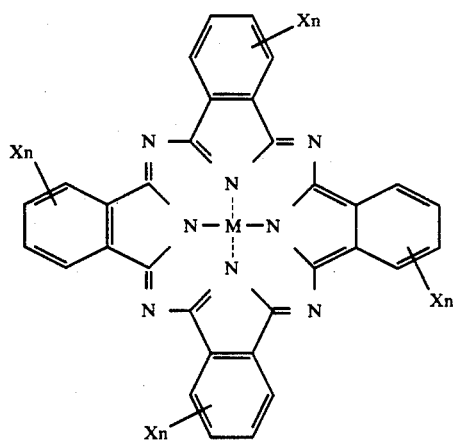
(13)
M = AlCl   X = S—⟨C₆H₄⟩—CH₃, n = 2
M = VO    X = SC₂H₃, n = 2
M = Cl4   X = F, n = 4
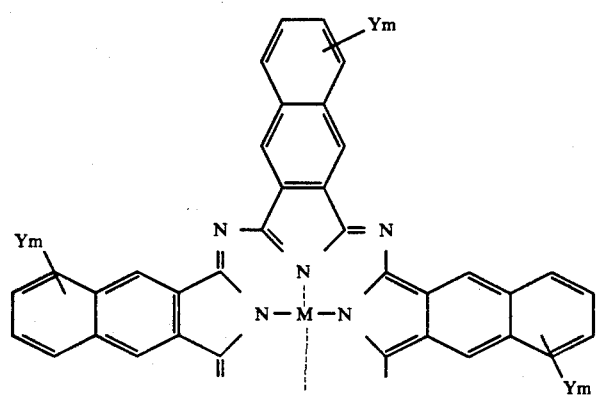
(14)

-continued
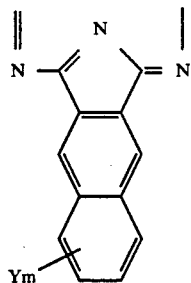
M = Zn      Y = H
M = AlCl    Y = H
M = SnCl₂   Y = H
M = VO      Y = tert-C₅H₁₄, m = 1
M = VO      Y = OC4H9, m = 1
M = VO      Y = Si(CH3)3, m = 1
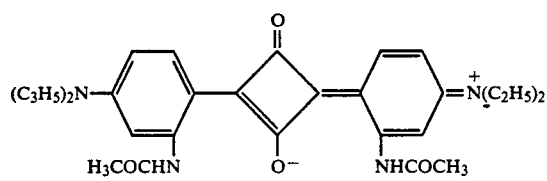
(15)
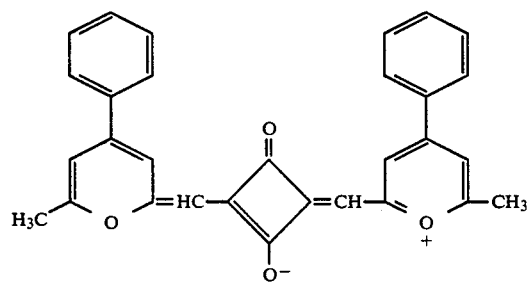
(16)
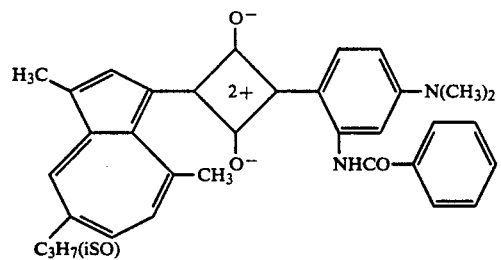
(17)
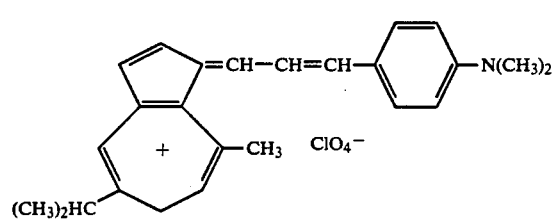
(18)

(19)

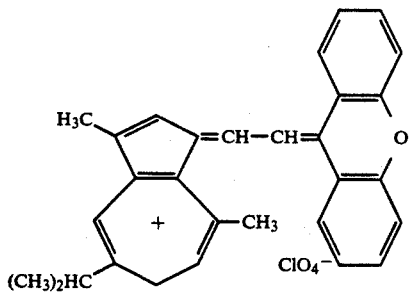

(20)

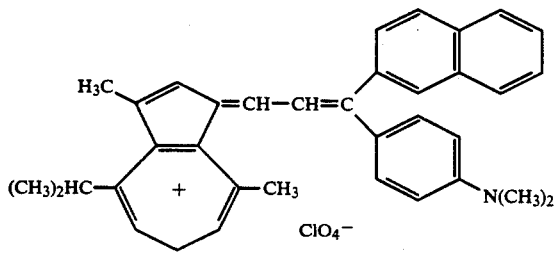

(21)

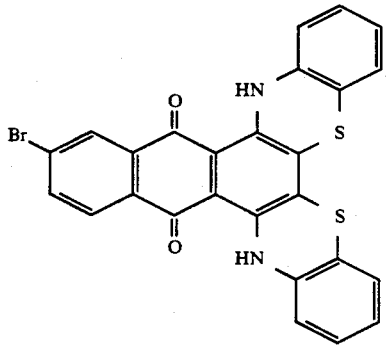

(22)

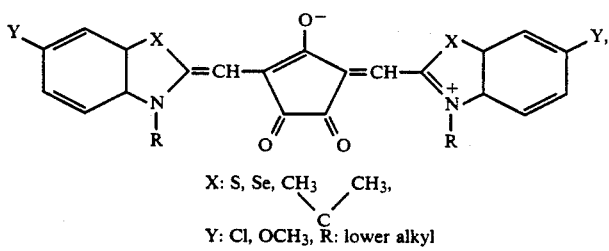

X: S, Se, $\underset{C}{CH_3 \diagdown \diagup CH_3}$,

Y: Cl, OCH₃, R: lower alkyl

The above infrared-absorbing absorbing coloring matters may be used singly or in combination. Among them, the preferred are (1), (2), (3), (5), (7), (8), (12), (13), (15), (17), (18), (21) and (22); the particularly preferred are (1), (2), (3), (7), (13), (15) and (21).

In the invention, there may also be used "infrared-absorbing coloring matters whose absorption in the visible region is virtually colorless". The term "absorption in the visible region is virtually colorless" means that the transmitted density of a layer containing the coloring matter is less than 0.15 in the wavelength region of 400 nm to 700 nm or the reflected density of the layer is less than 0.30. Such infrared-absorbing coloring matters are selected from the group consisting of compounds represented by the following formula D-1 to D-5, and a compound represented by the followong formula I.

D-1

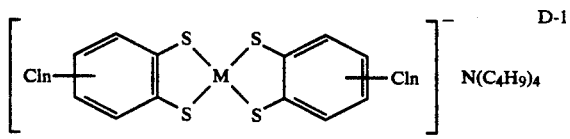

(In the formula, M is a transition metal (e.g., Ni), n is an integer of 1 to 4)

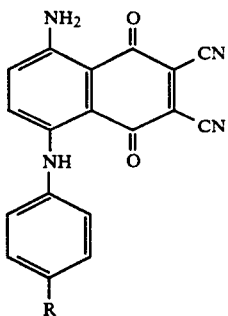

(In the formula, R represents, for example, $C_4H_9$, $OC_2H_5$ or $N(C_2H_5)_2$.)

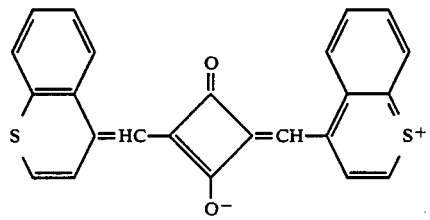

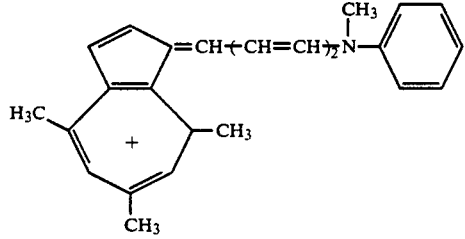

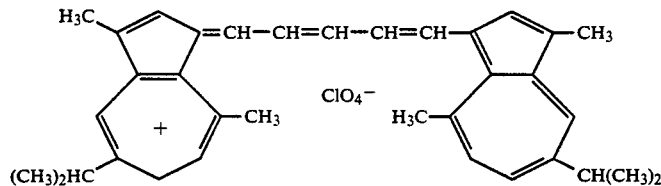

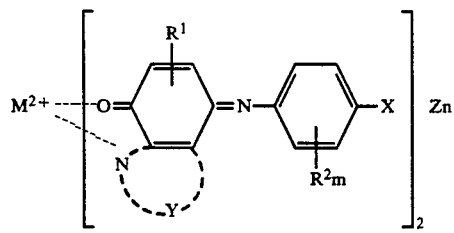

In the formula, $M^{2+}$ is a metal ion capable of forming a chelating compound; $R^1$ and $R^2$ each represent a hydrogen atom, a halogen atom or a monovalent organic group; X is

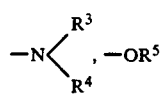

or a hydroxyl group, provided that $R^3$, $R^4$ and $R^5$ each represent an alkyl group which may have a substituent; Y is a 6-membered nitrogen-containing aromatic heterocycle together with

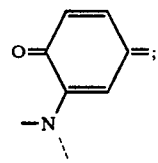

Z is an anion; m is 1 or 2; and n is 1 or 2.

The following (1) to (20) are examples of the compound included in formula I. Among them, compounds (1) to (18) which have a common structure are listed in Table 1 showing the contents of $M^{2+}$, $R^1$, m, $R^2$ and Zn in the structural formula given below.

D-2

D-3

D-4

D-5

Formula I

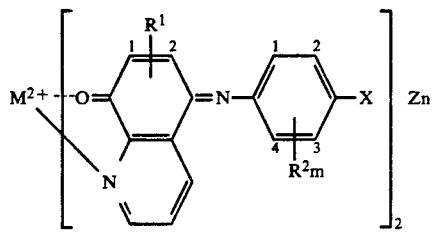

TABLE 1

| | $M^{2+}$ | $R^1$ | m | $R^2$ | X | $Z_\eta$ |
|---|---|---|---|---|---|---|
| (1) | $Ni^{2+}$ | H, | 1, | 1-$CH_3$, | $-N(C_2H_5)_2$, | $[(C_6H_5)_4B^-]_2$ |
| (2) | $Cu^{2+}$ | H, | 1, | 1-$CH_3$, | $-N(C_2H_5)_2$, | $[(C_6H_5)_4B^-]_2$ |
| (3) | $Ni^{2+}$ | 1-$CH_3$, | 1, | 1-$OCH_2$, | $-N\begin{array}{c}C_2H_5\\C_2H_4OH\end{array}$ , | $[(C_6H_5)_4B^-]_2$ |
| (4) | $Cu^{2+}$ | 1-Cl, | 2, | 1-$CH_2$,3-$CH_3$, | $-N\begin{array}{c}C_2H_5\\C_2H_4OCH_3\end{array}$ , | $[(C_6H_5)_4B^-]_2$ |
| (5) | $Zn^{2+}$ | 1-Cl, | 1, | 1-$CH_3$, | $-N\begin{array}{c}C_2H_5\\C_2H_4NHSO_4CH_3\end{array}$ , | $[(C_6H_5)_4B^-]_2$ |
| (6) | $Ni^{2+}$ | 1-$C_2H_5CONH-$, | 1, | H, | $-N\begin{array}{c}C_2H_5\\C_2H_5\end{array}$ , | $[(C_6H_5)_4B^-]_2$ |
| (7) | $Cu^{2+}$ | 1-$\langle C_6H_4\rangle$-CONH-, | 1, | 1-$CH_3$, | $-N\begin{array}{c}C_3H_7(n)\\C_3H_7(n)\end{array}$ , | $[(C_6H_5)_4B^-]_2$ |
| (8) | $Co^{2+}$ | 1-$C_2H_5SO_2NH$, | 1, | 1-$CH_3$, | $-N\begin{array}{c}C_2H_5\\C_2H_5Cl\end{array}$ , | $[(C_6H_5)_4B^-]_2$ |
| (9) | $Ni^{2+}$ | 1-$NHCOC_{14}H_{29}$, | 1, | 1-$CH_3$, | $-N\begin{array}{c}C_2H_5\\C_2H_5\end{array}$ , | $[(C_6H_5)_4B^-]_2$ |
| (10) | $Ni^{2+}$ | 1-NHCOCH($C_2H_5$)O-$\langle C_6H_4\rangle$-$C_5H_{11}$, | 1, | 1-$CH_3$, | $-N(C_2H_5)_2$, | $[ClO_4^-]_2$ |
| (11) | $Fe^{2+}$ | 1-$CONHC_6H_{13}$, | 1, | 1-$CH_2NHSO_2CH_3$, | $-N(C_2H_5)_2$, | $[C_{12}H_{25}-\langle C_6H_4\rangle-SO_3^-]_2$ |
| (12) | $Ni^{2+}$ | 1-$CONHCH_2CH_2O$-$\langle C_6H_3\rangle$($C_5H_{11}$)($C_5H_{11}$), | 1, | 1-$CH_3$, | $-N(C_2H_5)_2$, | $[Cl^-]_2$ |
| (13) | $Ni^{2+}$ | 1-$SO_2C_2H_5$, | 1, | 1-$CH_3$, | $-N\begin{array}{c}C_2H_5\\C_2H_4OCH_3\end{array}$ , | $[CF_3COO^-]_2$ |
| (14) | $Ni^{2+}$ | 2-$CH_3$, | 1, | 1-Cl, | $-N(C_2H_5)_2$, | $[C_6H_{13}COO^-]_2$ |
| (15) | $Cu^{2+}$ | 1-$OC_4H_9(n)$, | 1, | 1-$CF_3$, | $-N(C_2H_5)_2$, | $SO_4^-$ |
| (16) | $Ni^{2+}$ | -CONH-(benzothiazol-2-yl), | 1, | 1-$CH_3$, | $-N(C_2H_5)_2$, | $[(C_6H_5)_4B^-]_2$ |
| (17) | $Ni^{2+}$ | $-NHCOCF_3$, | 1, | 1-$CH_3$, | $-OH$, | $[(C_6H_5)_4B^-]_2$ |
| (18) | $Cu^{2+}$ | $-NHCO-\langle C_6H_5\rangle$, | 1, | 1-$CH_3$, | $-OC_2H_5$, | $[(C_6H_5)_4B^-]_2$ |

The following (19) is an example of the compounds included in formula I.

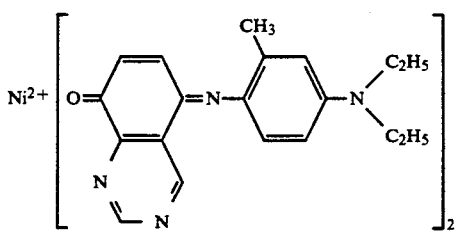

The following (20) is an example of the compounds included in formula I.

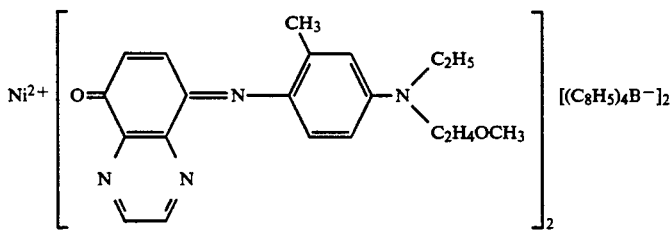

The binder used in the light-heat converting layer may be the same as those employed in the image receiving layer.

The thickness of the light-heat converting layer is preferably in a range from 0.1 to 5.0 μm, especially from 0.3 to 3.0 μm.

In the invention, it is not necessary to provide a light-heat converting layer when a light-heat converting substance is contained in an image receiving layer; but, when it is not contained, a light-heat converting layer has to be provided. The content of a light-heat converting substance in the light-heat converting layer is 5 to 50% by weight, and preferably, 10 to 30% by weight. Such a light-heat converting layer may be provided between an image-receiving support and a peelable layer, or between a peelable layer and an image-receiving layer. Further, it may be provided in both of these places. (Thermal transfer recording material)

The thermal transfer recording material used in the invention falls into two types: a sublimation type and a fusible type. The thermal transfer recording material of sublimation type has the structure comprised at least of a sublimation-transfer layer provided on a support.

Materials useful as a support for the sublimation type are polyester, polyamide, polyimide, polyvinyl chloride, polyvinylidene chloride, polyvinylidene fluoride, polyacrylates, polyolefin, polycarbonate, polystyrene, phenolic resin, cellulose triacetate, condenser paper and glassine paper. The thickness of a support is preferably 3 to 12 μm.

The sublimation-transfer layer is comprised of a sublimation dye, a binder and additives. Yellow dyes usable as a sublimation dye are Kayaset Yellow AG, Kayaset Yellow 963, MS Yellow VP, MS Yellow VPH, MS Yellow HSO-426, Microlex Yellow 6G, Foron Brilliant Yellow S-6GL and SYS-1 as well as methine dyes, quinophthalone dyes and azo dyes described in Japanese Pat. O.P.I. Pub. Nos. 78896/1984, 27594/1985, 31560/1985, 53565/1985, 12394/1986 and 122594/1988.

Usable magenta dyes are Kayaset Red TD-FB, MS Magenta VP, MS Magenta HM-1450, MS Magenta HSO-147, MS Red G, Microlex Violet R, Kayaset Red 130, SMS-2, SMS-3, SMS-4 and anthraquinone dyes, azomethine dyes and azo dyes described in Japanese Pat. O.P.I. Pub. Nos. 30392/1985, 30394/1985, 253595/1985, 262190/1986, 5952/1988, 205288/1988, 159/1989 and 63194/1989.

Examples of usable cyan dyes include Kayaset Blue 714, Kayaset Blue FR, Kayaset Blue 136, Kayaset Blue 814, Kayaset T Blue-776, MS Cyan VPG, MS Cyan HM-1238, MS Cyan HSO-144, MS Cyan HSO-16, Sirius Blue, SCM-1 and naphthoquinone dyes, anthraquinone dyes and azomethine dyes described in Japanese Pat. O.P.I. Pub. Nos. 78896/1984, 227948/1984, 24996/185, 53563/1985, 130735/1985, 131292/1985, 239289/1985, 19396/1986, 22993/1986, 31292/1986, 31467/1986, 35994/1986, 49893/1986, 148269/1986, 191191/1987, 91288/1988, 91287/1988 and 290793/1988.

The fusible-type thermal transfer recording material has the structure comprised at least of a fusible transfer layer provided on a support. The fusible transfer layer, which will do as long as it has a property of melting on heating and adhering to a support, is comprised of a dye, pigment, wax, binder and additives.

Suitable dyes or pigments include all the known dyes and pigments in the art; examples thereof are carbonates of alkaline earth metals, $TiO_2$, MgO, ZnO, alumina, silica, carbon black, Nigrosines, Sudan Black SM, Fast Yellow G, Benzidine Yellow, Pigment Yellow, Oil Yellow GG, Zapon Fast Yellow CGG, Sumiplast Yellow GG, Ind Fast Orange GG, Sumiplast Orange G, Pigment Orange R, Zapon Fast Orange GG, Irgadine Red, p-Nitroaniline Red, Toluidine Red, Resol Red 2G, Lake Red 0, Oil Scarlet, Zapon Fast Scarlet OG, Eizen Spilon Red BEH, Methyl Violet B Lake, Phthalocyanine Blue, Pigment Blue, Fastgen Blue 5007, Victria Blue F4R, Sudan Blue, Oil Peacock Bule, Brilliant Green B and Phthalocyanine Green.

As the wax, there may be employed the same types of waxes as those for the peelable layer. As the binder, the same types of binders as in the image-receiving layer may be utilized.

In order to improve the efficiency of thermal transfer, the fusible transfer layer may be formed into a multilayered structure of 1) a peelable layer and a coloring material layer, 2) a peelable layer, a coloring material layer and an adhering layer or 3) a coloring material layer and an adhering layer. The adhering layer uses primers, and the coloring material layer employs thermoplastic resins and waxes besides the above dyes, pigments or coloring materials.

Method for Thermal Transfer

The thermal transfer method of the invention is practiced in two modes: use of a sublimation thermal transfer recording material and use of a fusible one. But the transfer method itself does not differ in these modes, it comprises the steps of contacting an image receiving material with a thermal transfer recording material and irradiating the light corresponding to an image from the direction of the image receiving material or direction of the thermal transfer recording material, in order to transfer a coloring matter or ink corresponding to the light irradiated on the transfer layer to the image receiving layer.

In the invention, exposure can be performed from the direction of an image-receiving material or from that of a thermal transfer recording material; accordingly, the support on the exposed side should be light-transmittable. As the exposure light source, there can be used various ones, such as xenon lamp, halogen lamp, tungsten lamp, laser, LED and CRT, without limitation on their emission wavelengths as long as they are light sources of high intensities. Among them, the preferred are flash-lamps and laser beams. As the flash-lamp, a xenon flash having an emission half breadth of less than 10 ms and an emission intensity of more than 10 W/cm$^2$ is preferred. Preferred lasers are argon, helium and semiconductor lasers having an output larger than 50 mW.

The exposure with the above light source is carried out by means of contact exposure or scanning exposure. In contact exposure, a light-transmittable original is contacted with a recording material, and exposure is made from the direction of the light-transmittable original with the above high intensity light source. The exposing time is preferably less than 10 ms. An exposing time longer than 10 ms diffuses thermal patterns, lowering the quality of images.

In scanning exposure, a cylinder-scanning optical system or a plane-scanning optical system is used as a recording optical system. Of the two, the cylinder-scanning optical system is preferred for its lower light loss and capability of slenderizing the beams. (Method for preparing printing correction plates)

In the invention, a proof for printing can be prepared by carrying out the above thermal transfer in steps of transferring an image at least for each of the three colors of yellow, magenta and cyan and then retransferring the color image formed on the image receiving layer to another support. As an example of the method of retransferring to another support, the image side of the image receiving layer is superposed on another support such as art paper and passed through a laminator to retransfer the color image.

EXAMPLES

The examples of the invention are described below, but the embodiment of the invention is not limited to them.

EXAMPLE 1

Preparation of Thermal Transfer Recording Material

Paints Y, M and C for thermal transfer layers, each consisting of a uniform solution containing a sublimation dye, were prepared by treating mixtures of the following compositions by use of a paint conditioner.

| (Ink layer paint Y) | |
|---|---|
| Kayaset Yellow AG (product of Nippon Kayaku) | 10 g |
| Nitrocellulose resin | 20 g |
| Methyl ethyl ketone | 400 ml |
| (Ink layer paint M) | |
| MS Magenta VP (product of Mitsui Toatsu) | 10 g |
| Nitrocellulose resin | 20 g |
| Methyl ethyl ketone | 400 ml |
| (Ink layer paint C) | |
| Kayaset Blue FR (product of Nippon Kayaku) | 10 g |

| -continued | |
|---|---|
| Nitrocellulose resin | 20 g |
| Methyl ethyl ketone | 400 ml |

Each of the above paints was coated and dried on a 4.5-μm thick polyethylene terephthalate (PET) film to give a dry thickness of 1.0 g/m$^2$ using a wire bar, so that a thermal transfer recording material having a thermal transfer layer on the PET film was prepared for each of the colors. These are referred to as thermal transfer recording materials Y, M and C, respectively. For the purpose of sticking prevention, a nitrocellulose layer containing a silicone-modified urethane resin (SP-2105 made by Dainichiseika) was provided beforehand on the back side of the PET film.

Preparation of Image Receiving Material

A polyester substrate incorporated with titanium dioxide (white PET) was coated with a polyester resin to form a subbing layer, then, a peelable layer composition prepared by kneading the following composition for 6 hours in a ball mill was coated thereon to a dry coating weight of 5 mg/dm$^2$ to from a peelable layer.

| (Peelable layer composition) | |
|---|---|
| Carnauba wax | 95 g |
| Ethylene-vinyl acetate copolymer | 5 g |
| (Evaflex EV40Y made by Mitsui Dupont Chem.) | |
| Toluol | 400 g |

Subsequently, the following image receiving layer composition was coated thereon to a dry thickness of 4μ to obtain an image receiving material.

| (Image receiving layer composition) | |
|---|---|
| Infrared absorbing dye No.15 | 5 g |
| Vinyl chloride resin | 10 g |
| Polyester-modified silicone | 0.25 g |
| Methyl ethyl ketone | 200 ml |
| Cyclohexanone | 50 ml |

Method for Thermal Transfer

The above thermal transfer recording material and the image receiving material were superposed upon each other, with the transfer layer of the thermal transfer recording material being in contact with the image-receiving layer of the image receiving material. Then, these were subjected to scanning exposure from the direction of the thermal transfer recording material at a speed of 150 m/sec, by use of a 1-W semiconductor laser beam converged to 30 μm. Thus, the dye on the exposed portion was transferred to the image receiving material, forming a sharp image on the image receiving layer.

Preparation of Proof for Printing

After carrying out the above transfer procedure for each of the yellow, magenta and cyan colors, the image of the three colors formed on the image receiving material was contacted with a sheet of art paper and then passed through a laminator having a hot plate temperature of 140° C. As a result, a sharp color image was transferred to the art paper.

EXAMPLE 2

Preparation of Thermal Transfer Recording Material

A thermal transfer recording material was prepared in the same procedure as in Example 1.

Preparation of Image Receiving Material

After forming a subbing layer on a titanium-dioxide-incorporated polyester substrate by coating a polyester resin, a peelable layer was formed thereon by coating the following peelable layer composition so as to give a dry thickness of 1.0 μm. Next, a light-heat converting layer was formed thereon by coating the following light-heat converting layer composition to give a dry thickness of 2.0 μm.

| (Peelable layer composition) | |
| --- | --- |
| Poly-ε-caprolactam (Placcel H-1 made by Daicel Chem.) | 50 parts by wt |
| Paraffin wax (melting point: 73° C.) | 50 parts by wt |
| (Light-heat converting layer composition) | |
| Infrared absorbing dye (compound of formula 1-(9)) | 5 parts by wt. |
| Polyester resin (Vylon 200 made by Toyobo) | 5 parts by wt. |
| Methyl ethyl ketone | 100 parts by wt. |

Subsequently, an image receiving layer was formed thereon by coating the following image receiving layer composition to give a dry coating weight of 0.5 g/m².

| (Image receiving layer composition) | |
| --- | --- |
| Vinyl chloride resin (polymerization degree: 600) | 10 parts by wt. |
| Polyester-modified silicone | 0.5 part by wt. |
| Methyl ethyl ketone | 100 parts by wt. |

Thermal Transfer and Preparation of Proof for Printing

The above thermal transfer recording material and the image receiving material was superposed upon each other so as to contact the transfer layer of the thermal transfer recording material with the image receiving layer of the image receiving material. Then, these were subjected to scanning exposure at a speed of 150 m/sec from the direction of the thermal transfer recording material by use of a 1-W semiconductor laser beam converged to 30 μm. While being conveyed at a speed of 22.5 mm/sec after the exposure, these were separated at a position 10 mm away from the exposed point to transfer the exposed portion of the ink layer to the image receiving layer. After performing the above procedure for each of the yellow, magenta and cyan colors, the image of the three colors formed on the image-receiving material was superposed upon a sheet of art paper and passed through a laminator. Thus, a sharp color image was transferred to the art paper. The hot plate temperature of the laminator was 110° C.

EXAMPLE 3

Preparation of Thermal Transfer Recording Material

The same as in Example 2.

Preparation of Image Receiving Material

After forming a subbing layer on a titanium-dioxide-incorporated polyester substrate by coating a polyester resin, the following light-heat converting layer was formed thereon so as to give a dry thickness of 3.0 μm, and subsequently, a peelable layer was provided thereon in the same manner as in Example 2.

| (Light-heat converting layer) | |
| --- | --- |
| Carbon black | 50 parts by wt. |
| Polyvinyl butyral resin (Eslec BLS made by Sekisui Chem.) | 50 parts by wt. |
| Ethyl alcohol | 500 parts by wt |

Thermal Transfer and Preparation of Proof for Printing

Thermal transfer and preparation of proof for printing were carried out in the same manner asw in Example 2. The results obtained were much the same as in Example 2.

EXAMPLE 4

The procedure in Example 1 was repeated except that light-heat converting substance No.15 used in the image receiving layer was varied to Nos. 1, 3, 7, D-1, D-3 and formula I-(12), the results obtained were much the same as in Example 1.

EXAMPLE 5

A proof for printing was prepared in the same procedure as in Example 2, except that the following peelable layer was provided in a dry thickness of 0.5 μm instead of the peelable layer used in Example 2. A sharp printing correction plate was obtained as in Example 2.

| (Peelable layer) | |
| --- | --- |
| Silicone-modified polyurethane resin (SP-2105 made by Dainichiseika) | 10 parts by wt. |
| Methyl ethyl ketone | 100 parts by wt. |

COMPARISON 1

Thermal transfer, preparation of a proof for printing and evaluation thereof were made in the same manner as in Example 1, by use of a thermal transfer recording material and an image receiving material prepared in the same procedure as in Example 1 except that the peelable layer was not formed in the image receiving material. But the image receiving layer was not transferred well to art paper. As a result, the proof for printing could not be obtained.

COMPARISON 2

Thermal transfer, preparation of a proof for printing and evaluation thereof were made in the same manner as in Example 2, by use of a thermal transfer recording material and an image receiving material prepared in the same procedure as in Example 2 except that the peelable layer was not formed in the image receiving material. The results obtained were much the same as in Comparison 1.

COMPARISON 3

Thermal transfer, preparation of a proof for printing and evaluation thereof were made in the same manner as in Example 3, by use of a thermal transfer recording material and an image receiving material prepared in the same procedure as in Example 3 except that the peelable layer was not formed in the image receiving material. The results obtained were much the same as in Comparison 1.

COMPARISON 4

Thermal transfer, preparation of a proof for printing and evaluation thereof were made in the same manner as in Example 4, using a thermal transfer recording material and an image receiving material prepared in the same procedure as in Example 4 except that the peelable layer was not formed in the image receiving material. But the image receiving layer was not transferred well to art paper similarly to Comparison 1.

COMPARISON 5

Thermal transfer, preparation of a proof for printing and evaluation thereof were made in the same manner as in Example 5, using a thermal transfer recording material and an image receiving material prepared in the same procedure as in Example 5 except that the peelable layer was not formed in the image receiving material. The results obtained were about the same as in Comparison 1.

What is claimed is:

1. A thermal transfer image receiving material consisting essentially of a support and provided thereon, a layer containing a light-heat converting substance in an amount of 5 to 50% by weight and a binder, a peelable layer, and an image receiving layer in this order.

2. The material of claim 1, wherein said light-heat converting substance is selected from the group consisting of carbon black, carbon graphite, phthalocyanine pigment, iron powder, graphite powder, iron oxide powder, lead oxide, and blackened silver.

3. The material of claim 1, wherein said light-heat converting substance is an infra-red absorbing colorant selected from the group consisting of cyanine dyes, naphthoquinone dyes, and phthalocyanine dyes.

4. The material of claim 3, wherein said infra-red absorbing colorant is selected from the group consisting of compounds represented by the following formulas D-1, D-2, D-3, D-4, D-5, and a compound represented by the following formula 1;

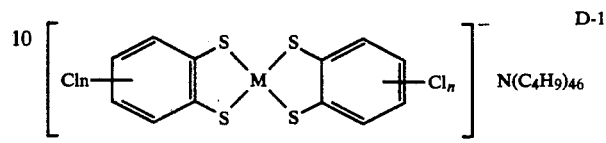

wherein M represents a transition metal, and n is an integer of 1 to 4,

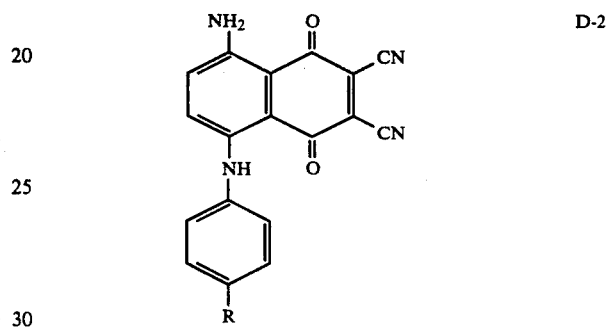

wherein R represents —$C_4H_9$, —$OC_2H_5$ or —$N(C_2H_5)_2$,

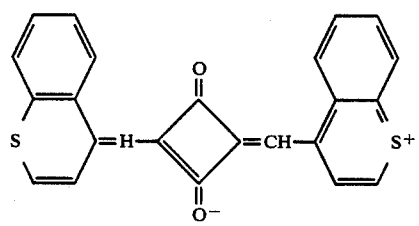

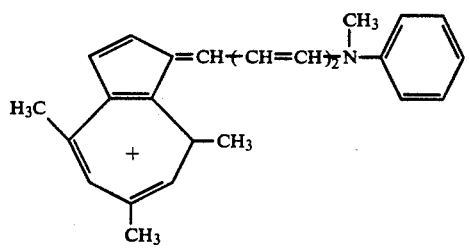

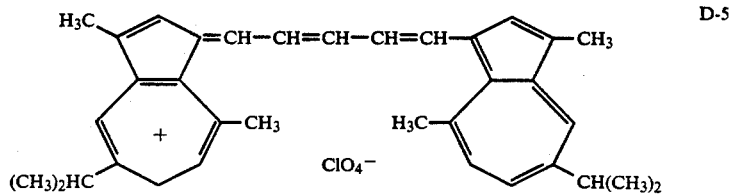

-continued formula I

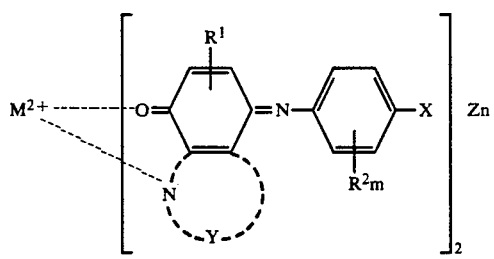

wherein $M^{2+}$ represents a metal ion capable of forming a chelating compound, $R^1$ and $R^2$ each represent a hydrogen atom, a halogen atom or a monovalent organic group, X represents —$N(R^3)(R^4)$, —$OR^5$ or a hydroxy group, provided that $R^3$, $R^4$ and $R^5$ each represent an alkyl group, Y represents a 6-membered nitrogen containing aromatic heterocycle together with

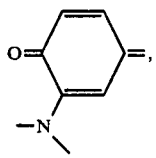

Z is an anion, m is 1 or 2, and n is 1 or 2.

5. The material of claim 1, wherein said layer containing a light-heat converting substance contains said light to heat converting substance in an amount of 10–30% by weight.

6. A method for preparing a proof for printing, comprising the steps of;
contacting a thermal image transfer layer onto a thermal transfer image receiving material, said thermal transfer image receiving material comprising a support and provided thereon, a layer containing a light-heat converting substance in an amount of 5 to 50% by weight and a binder, a peelable layer and a first image receiving layer in this order,
imagewise exposing the contacted materials to light,
transferring the exposed portions of the thermal image transfer layer to the first image receiving layer, said transferring comprising the transfer of at least yellow, magenta, and cyan color images on the first image receiving layer to form a color image, and
transferring the formed color image to a second image receiving layer.

7. The method of claim 6, wherein said layer containing a light-heat converting substance contains said light to heat converting substance in an amount of 10–30% by weight.

* * * * *